(12) United States Patent
Arp

(10) Patent No.: US 6,765,446 B2
(45) Date of Patent: Jul. 20, 2004

(54) FREQUENCY LOCK LOOP HAVING A RELOADABLE COUNTER WITHOUT ROLLOVER

(75) Inventor: Ronald Arp, Greeley, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/251,100

(22) Filed: Sep. 18, 2002

(65) Prior Publication Data

US 2004/0056724 A1 Mar. 25, 2004

(51) Int. Cl.$^7$ ................................................. H03L 7/06
(52) U.S. Cl. ........................... 331/25; 331/1 A; 331/17
(58) Field of Search ........................... 331/1 A, 16, 17, 331/18, 25; 327/155, 48; 332/127; 360/51; 455/260; 324/76.48

(56) References Cited

U.S. PATENT DOCUMENTS

| | | | |
|---|---|---|---|
| 3,753,141 A | * 8/1973 | Van Elk et al. ............. 331/1 A |
| 4,009,449 A | 2/1977 | Agans | |
| 4,316,152 A | * 2/1982 | Meyer ........................ 331/1 A |
| 4,520,327 A | * 5/1985 | Myers .................... 331/177 R |
| 5,535,067 A | 7/1996 | Rooke | |
| 6,268,780 B1 | 7/2001 | Olgaard et al. | |

\* cited by examiner

Primary Examiner—David Mis

(57) ABSTRACT

A frequency lock loop has a reloadable N counter that counts cycles of an output frequency during one cycle of a reference frequency. A VCO generates the output frequency. A VCO control drives the VCO based on the count from the counter. The VCO control may include a latch for latching the count at each reference frequency cycle. The VCO control may include a VCO driver, such as a D/A converter or proportional charge pump, connected to a voltage control as input to the VCO. The counter may be reloaded with the integer N value at each cycle of the reference frequency. The counter may decrement from the integer value at each cycle of the output frequency. A lock may occur at N times the reference frequency without regard to phase between output and reference frequencies.

19 Claims, 3 Drawing Sheets

FREQUENCY LOCK LOOP HAVING A RELOADABLE COUNTER WITHOUT ROLLOVER

BACKGROUND OF THE INVENTION

Prior art feedback control electronics are known to include the phase locked loop ("PLL"). The typical PLL includes a low pass filter, a phase detector, and a feedback loop coupling a voltage-controlled oscillator ("VCO") to the phase detector. The PLL locks an input signal to the phase detector with the oscillations of the VCO. Specifically, the phase detector tracks the difference in phase and frequency between the input signal and the signal output by the VCO, and outputs a signal proportional to that difference. The low pass filter removes AC components of the phase detector signal to drive the input to the VCO. The circuit is arranged to drive the VCO towards a zero phase difference, creating a "locked" loop. A PLL thus measures and adjusts phase and frequency.

A common use of the PLL is to generate a fixed multiple of the input signal frequency. In this case, an N counter (or divider) is part of the feedback loop. The counter divides the VCO output by N. One problem with such a PLL occurs when the input signal derives from a variable frequency source—which requires a high or variable N value that may make the PLL unstable.

The PLL comes in various forms. By way of example, the PLL may exist as integrated circuitry within complex processor designs. Often the role of the PLL in such designs is to generate a selected clock rate. The prior art PLL can be overly complex for this purpose. Moreover, the prior art PLL may be unstable since the processor design may seek to utilize a variable frequency source as input to the PLL.

SUMMARY OF THE INVENTION

In one aspect, a frequency lock loop ("FLL") is provided. The FLL may operate to generate an output frequency ($F_{out}$) that is an integer multiple of an input reference frequency ($F_{ref}$); though the FLL may operate without-regard to phase differences between $F_{ref}$ and $F_{out}$. The FLL may include a latch at the input of the $F_{ref}$ signal line. A VCO driver or other device (e.g., a digital-to-analog ("D/A") converter or proportional charge pump) may connect with the latch to drive the input voltage of a VCO. An output of the VCO may couple with a reloadable N counter in a feedback loop coupled with the latch, with the $F_{ref}$ signal line connected to load the counter. $F_{ref}$ may also clock the latch.

In one aspect, the counter is loaded with an integer value N at a clocking edge (leading or trailing) of the $F_{ref}$ signal line. A bus connected with the counter may be used to load the value N. The counter may count a sequence of $F_{out}$ cycles before the next end of one $F_{ref}$ cycle, at which point the counter may be reloaded with the value N. By way of example, during one cycle of $F_{ref}$, the counter counts down from N to a maximum negative amount without overflowing. A typical counter for example counts from a maximum of "16" or "32", as "N", to a maximum negative "16" or "32", respectively. If for example N is ten and the counter counts from ten to minus four, then the counter may generate an output count of minus four as input to the latch; the value of minus four is loaded to the latch at the next clocking edge of $F_{ref}$. In one aspect, if the counter reaches its maximum negative count, that maximum negative count value is latched as input to the VCO.

A value from the latch may be input to the VCO driver to drive the VCO output of $F_{out}$ closer to $N*F_{ref}$. In one example, the VCO driver is a D/A converter, converting the latched value to an analog voltage signal that modifies the voltage control to the VCO. If the output from the counter is minus four, then the D/A converter for example reduces the voltage to the VCO by an amount corresponding to minus four; if the output from the counter is minus nine, then the D/A converter for example reduces the voltage to the VCO by a greater amount corresponding to minus nine; if the output from the counter is six, then the D/A converter for example increases the voltage to the VCO by an amount corresponding to six; and so on.

In one example, the VCO driver is a proportional charge pump. An $F_{out}$ clock signal may input to the proportional charge pump such that the charge pump proportionally drives the VCO. By way of example, the proportional charge pump may convert the latched value to a voltage or current input to the VCO that is biased by the number of $F_{out}$ cycles within a single $F_{ref}$ cycle. Such a technique may be used to accelerate loop lock of the FLL.

Those skilled in the art should appreciate that other VCO drivers exist to accomplish like functions. Regardless of VCO driver form, a frequency "lock" may occur when the counter output is "zero" and the VCO is N times the input frequency. A FLL can be more stable with a larger N value counter.

In one aspect, an improved processor is provided. The processor operates at a first clock frequency and includes at least one FLL to generate one or more second clock frequencies from the first clock frequency and based on the value N. The processor may have an internal clock operating at 1 GHz or more. In one example, the first clock frequency corresponds to bus frequencies of the processor and the second clock frequency corresponds to greater frequencies for use within the processor, up to and including the speed of the internal clock. A processor bus connected with the FLL may load the FLL with a value N.

Certain advantages are realized by the FLL. By way of example, the FLL may be more stable with a greater frequency difference between the input and output frequencies, as the FLL may better detect frequency errors. In contrast, the prior art PLL becomes increasingly unstable as the frequency difference increases, due to a frequency and phase error sensitivity that increases in proportion to the frequency difference. In another example, as technology advances, the clock speed of processor technology tends to increase more quickly than the bus speed connecting that processor to other devices; accordingly, there is an increasing frequency difference between bus speed and processor clock speed. When the bus provides the input signal, the prior art PLL has difficulty tracking the frequency difference to the processor clock speed. The FLL on the other hand is more stable with this increasing frequency difference, thereby assisting the advancement of modern processor design. Clock stability is an important design consideration in processor development. As the clock rate varies, additional margin is desired to account for frequency differences. If there is a 10% variation in the clocking edges of a 3 GHz processor, for example, that processor may be designed to run at a minimum of 3.3 GHz to handle clock variations, adding significant effort and costs to the processor design. As the input to output multiplication factor increases, the prior art PLL becomes more sensitive to noise sources, causing additional jitter in the output. In contrast, increasing the multiplication factor for the FLL increases the number of clock samples used to determine frequency error, thereby decreasing the FLL's sensitivity to random noise events, due to averaging.

DETAILED DESCRIPTION OF THE DRAWINGS

Figure 1:
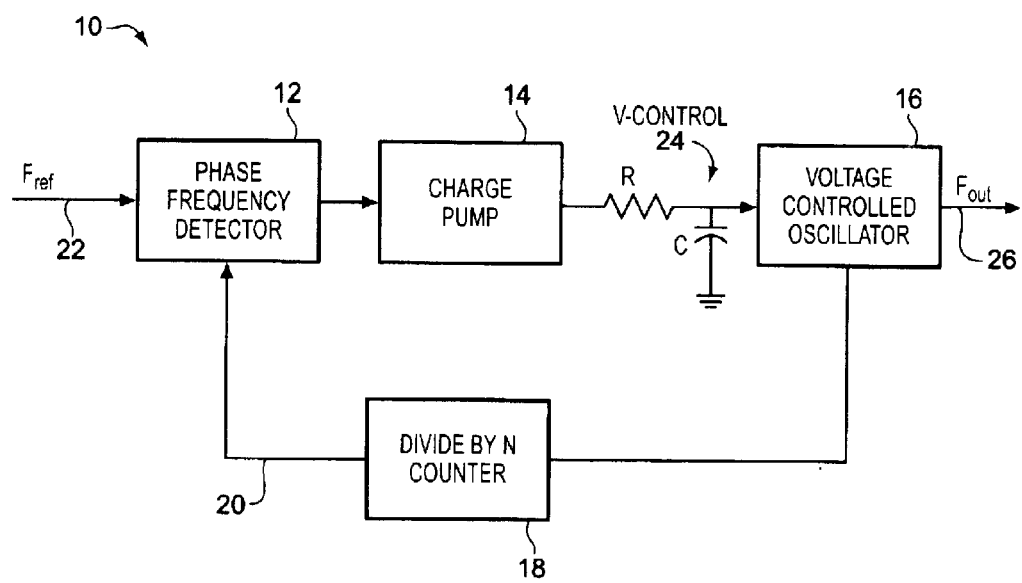
FIG. 1 shows a prior art PLL.

FIG. 1 shows a prior art PLL 10; PLL 10 includes a phase frequency detector 12, charge pump 14, VCO 16 and divide-by-N counter 18. PLL 10 operates to adjust the frequency of VCO 16 until the phase and frequency output signal 20 of divide-by-N counter 18 matches the phase and frequency ($F_{ref}$) of the input signal 22 of PLL 10. To accomplish this, phase frequency detector 12 detects the clock edges of signals 20, 22, determines which signal 20, 22 leads, and drives charge pump 14 to increase or decrease a control voltage 24 (illustrated by resistor R and capacitor C) to VCO 16 in order to compensate for phase and frequency between signals 20, 22. Divide-by-N counter 18 divides the output of VCO 16 by a constant value of integer N. Subject to certain input conditions, PLL 10 will thereafter lock a phase and frequency ($F_{out}$) of an output signal 26 of VCO 16 to $F_{ref}$ of input signal 22.

Figure 2:
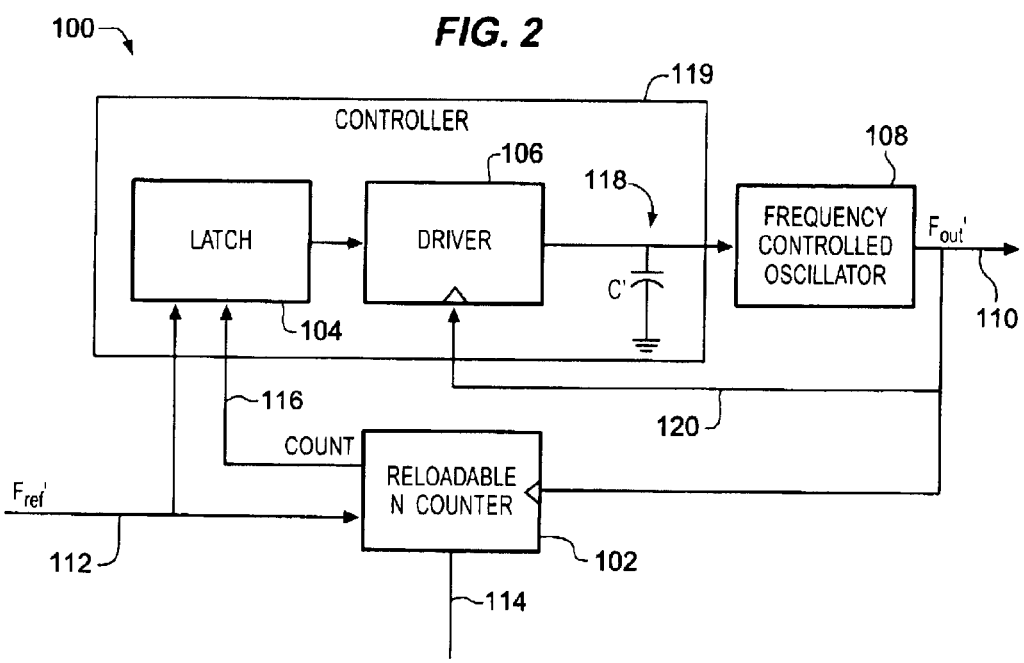
FIG. 2 schematically shows one FLL.

FIG. 2 shows one FLL 100, including a reloadable-N counter 102, controller 119, and frequency controlled oscillator 108. Controller 119 may for example include latch 104, driver 106, and voltage control 118. Frequency controlled oscillator 108 may for example be a VCO, and driver 106 may for example be a VCO driver such as a proportional charge pump or D/A converter.

FLL 100 operates to generate an output frequency $F_{out}'$, at signal line 110, from an input reference frequency $F_{ref}'$, via signal line 112. A bus 114 loads counter 102 with an integer value N'; the value N' reloads at each cycle of $F_{ref}'$. Counter 102 then counts by incrementing or decrementing to a maximum counter capability without overflowing.

More particularly, counter 102 may operate to count a number of cycles of $F_{out}'$ that occur for every cycle of $F_{ref}'$. In one example, counter 102 generates its count by decrementing from N': if for example N' is loaded as "16", and if there are six cycles of $F_{out}'$ for one cycle of $F_{ref}'$, then the count from counter 102 is "10". In another example, if N' is loaded as "32" and there are forty cycles of $F_{out}'$ for one cycle of $F_{ref}'$, then the count from counter 102 is "−8".

As illustrated, the count from counter 102 is input to latch 104 via signal line 116. FLL 100 then compares the count of counter 102 with the number "0" on a clocking edge of $F_{ref}'$ from signal line 112 to latch a value as input to driver 106.

In one embodiment, driver 106 charges capacitor C' to provide a fixed charge into control voltage 118, based on the latched value. Driver 106 may for example be a D/A converter to accomplish such a function. The D/A converter converts the positive or negative count value and inputs a corresponding charge increase or decrease to frequency controlled oscillator 108.

In another embodiment, driver 106 provides a proportional charge to control voltage 118. By way of example, driver 106 may be a proportional charge pump clocked by $F_{out}'$ via signal line 120. In this embodiment, driver 106 inputs a fixed charge to voltage control 118 over a time period defined by a number of $F_{out}'$ cycles; that fixed charge may again correspond to the count from counter 102.

FLL 100 may thus operate as follows: if the count from counter 102 is negative, then frequency controlled oscillator 108 operates too fast; if the count is positive, then frequency controlled oscillator 108 operates too slow; if the count is "0", then FLL 100 operates at N' times $F_{ref}'$. Accordingly, FLL 100 may adjust to produce an output signal 110 with a frequency $F_{out}'$ equal to N' times $F_{ref}'$. $F_{out}'$ may be generated without regard to phase of input signal 112.

FLL 100 provides certain advantages over the prior art PLL. By way of example, unlike the prior art PLL, FLL 100 operates well with large and/or variable N' values. Moreover, FLL 100 can respond to an average of $F_{ref}'$ to produce an average output frequency $F_{out}'$. In processor design, FLL 100 provides additional advantages over the prior art PLL. For example, it is often unnecessary to track phase within a reference clock of the processor, and thus FLL 100 also simplifies circuitry. Accordingly, FLL 100 is less sensitive to system environments that may cause errors with the PLL; there are also fewer input conditions to qualify operation of FLL 100 as compared to the prior art PLL. In another advantage, unlike the counter within the PLL, counter 102 need not roll over after reaching a maximum negative count; instead counter 102 may output its maximum negative value for a given $F_{ref}'$ cycle. In the event that counter 102 does roll over, FLL 100 detects this condition to determine, for example, whether $F_{out}'$ is too fast, so that FLL 100 can slow down.

Figure 3:
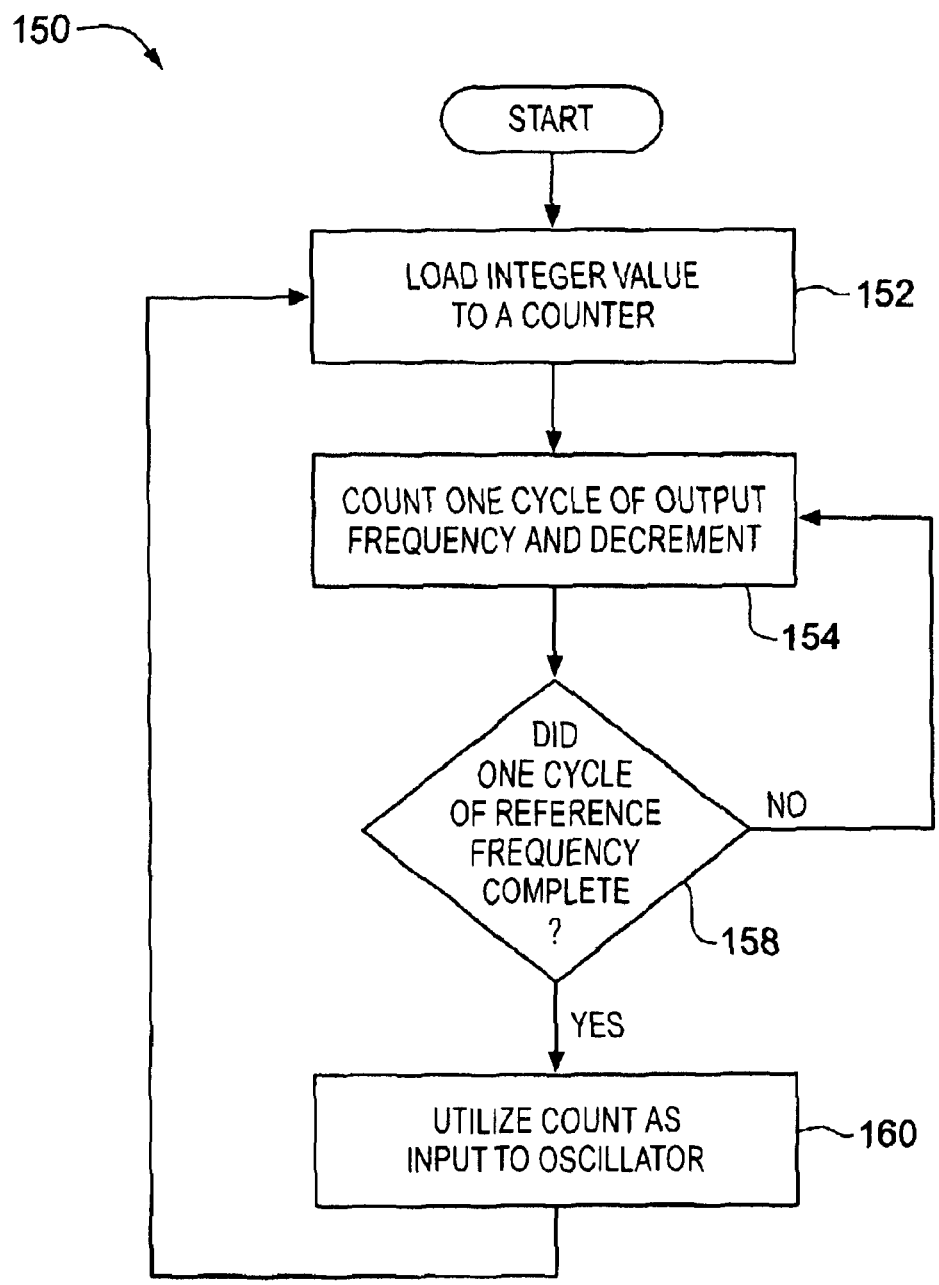
FIG. 3 shows a flowchart illustrating one frequency lock method.

FIG. 3 shows a flowchart 150 illustrating one method for generating an output frequency locked to a reference frequency. In step 152, a counter is loaded with an integer value such as N' as initiated by the reference frequency. In step 154, the counter decrements from the integer value for one cycle of the output frequency. If 158 a complete cycle of the reference frequency has not completed, the counter again decrements for one cycle of the output frequency. If 158 a reference frequency cycle has completed, the count is output and utilized as input to an oscillator, in step 160. By way of example, step 160 may include converting the count to a D/A converter as input to a voltage control for a VCO. Step 160 may also include the step of latching an output of the counter at a clocking edge of the reference frequency; accordingly, the loading of N' and the latching of an output count from the counter may occur substantially at the same time. Step 160 may further include the step of utilizing a proportional charge pump clocked by $F_{out}'$. Those skilled in the art should appreciate that the FLL or methods described herein in connection with FIG. 2 and FIG. 3 may encompass a variety of different oscillators like the VCO. For example, the FLL may utilize a current controlled oscillator, a voltage controlled oscillator, or other like-functioning unit.

Figure 4:
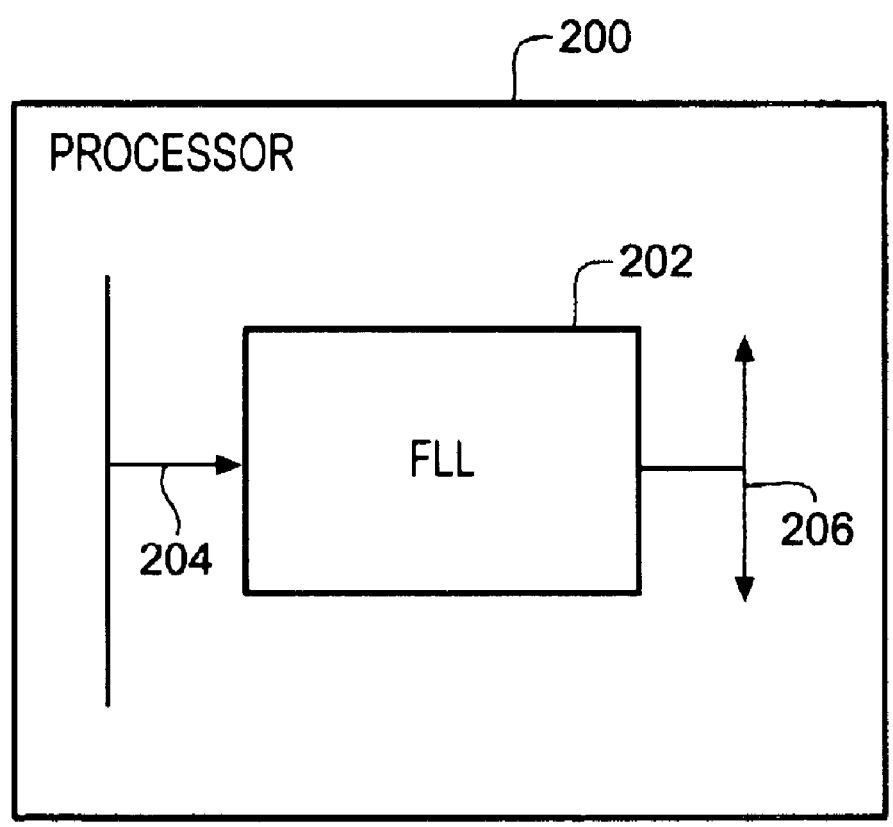
FIG. 4 shows an improved processor utilizing one internal FLL.

FIG. 4 shows one processor 200 utilizing a FLL 202. FLL 202 has an input reference frequency from a bus 204 of processor 200. Bus 204 may also load a counter of FLL 202 with a value such as N'. FLL 202 generates an output frequency on a signal line 206 in accord with the teachings herein. The output frequency may for example be an integer multiple frequency of the reference frequency, based on the integer value loaded to FLL 202. In one example, the output frequency corresponds to operating clock frequencies of processor 200. Those skilled in the art should appreciate that processor 200 has many other components and functions other than those illustrated in FIG. 4, and that FIG. 4 is simplified for purposes of illustration.

The following C source code provides a non-limiting simulation of a frequency lock loop in accord with certain teachings herein. The code uses "0" to indicate a reference frequency. Those skilled in the art should appreciate that other simulations, source code, hardware design and/or electronic detail, as a matter of design choice, can similarly provide frequency lock control methodology without departing from the scope herein.

```c
// Frequency Lock Loop Simulator
// Compile as: cc -Ae fll.c -lm -o fll
#include <stdio.h>
#include <stdlib.h>
#include <strings.h>
#include <math.h>
int main()
// This routine sets up and runs a simulation.
{
    // Variables used for the simulations.
    FILE *fll_out;
    double vco_time; // A static variable used by the VCO
    double time; // The current time for the simulation
    double timestep; // The size of the time steps to take
    double runtime; // Total time for the run
    double vcogain; // The voltage to frequency gain for the VCO
    double vcooffset; // The offset voltage for the VCO
    double icntl; // The current being supplied by the charge pump
    double igain; // The charge pump current change based on vcntl
    double vcntl; // The VCO control voltage
    double leakage; // The leakage value for the control cap
    double cap; // The capacitance of the control cap
    double iref; // The per unit reference for the charge pump output
    double fref; // The input reference frequency
    double freftime; // The last time the reference was checked
    double ferror; // Frequency error between the VCO and Fref*N
    double ranvcntl,ranvco; // Amplitude for random changes in signals
    double rnum1,rnum2;
    double total_time;
    double endtime;
    int vco_output; // The current output of the VCO
    int nlst; // Tracks edge changes in the VCO
    int divn,divnsize; // The divide by N counter
    int loadn; // The reload value for the N counter
    int latch; // The latch for time slices
    int latchlimit; // The maximum count limit for the current source
    int detail; // The simulation report detail
    float ftemp;
    char answ,textstr[80], fname[80];
    int itemp,simprcnt;
    // Initialize the simulation
    leakage=1E12; // Leakage impedance for the capacitor is 1000 Mohm
    timestep=1E-13; // Default time slice is 1 ps
    runtime=1E-5; // Run simulation for 10 usec
    total_time=0.0; // Total accumlitive run time of the simulation
    vcogain=1.0; // Default VCO gain is 1GHz/volt
    vcooffset=0.0; // Default no VCO offset
    vcntl=0.5; // Default control voltage is for 500 MHz
    cap=125e-12; // Filter Cap is 125 pf
    iref=400e-6; // The charge pump supplies 400 uA of current
    igain=0; // The charge pump current does not change with vcntl
    fref=7.5e6; // Reference frequency is 7.5 MHz
    nlst=0;
    divn=loadn=133; // Operating frequency is 133*fref or 998 MHz
    divnsize=9; // Divn counter is 8 bit
    latch=0; // No correction initially
    latchlimit=1024; // Maximum correction time is 30 counts
    ranvcntl=ranvco=0.0; // Amplitude for random changes in signals
    detail=1; // Set report detail
    strcpy(fname, "fll.out");
    endtime=0.0;
    srand48((long int) 5); // initialize the random number generator
    // Start the simulations
    do {
        printf("FLL Simulator\n");
        printf(" Current Initial conditions:\n");
        printf("     VCO gain - %.3g GHz/V;",vcogain);
        printf(" offset - %.3g Volts\n",vcooffset);
        printf("     Control Voltage - %.3g Volts\n",vcntl);
        printf("     Filter Cap %.3g pF",cap*1e12);
        if(0<leakage) {
            printf(" Cap. Leakage - %g Mohms to GND\n",leakage*1e-6);
        } else {
            printf(" Cap. Leakage - %g Mohms to 1.5V supply\n",-leakage*1e-6);
        }
        printf("  Charge Pump iref - %g uA\n",iref*1e6);
        printf("  Charge Pump iref gain - %g uA/Volt\n",igain*1e6);
        printf("  Div N Size %d; Reload Value %d\n",divnsize,loadn);
        printf("  Max correction limit %d\n",latchlimit);
```

-continued

```
printf("  Reference Frequency - %g MHz\n",fref*1e-6);
printf("  Random control noise amplitude - %g Volts\n",ranvcntl);
printf("  Random VCO time jitter - %g nsec\n",ranvco*1e9);
printf("  Simulation Length %g usec;",runtime*1e6);
printf(" Simulation Step Size %g nsec\n",timestep*1e9);
printf("  Result file - <%s>",fname);
printf(" Report Detail Level - %d\n",detail);
printf("\n    (U)pdate Settings\n    (R)un simulation\n");
printf("  (C)ontinue simulation\n    (E)xit\n");
fflush(stdin);
scanf("%c", &answ);
if('u'==answ || 'U' == answ) { // Update the default settings
    printf("   A) VCO Gain\n");
    printf("   B) VCO Offset\n");
    printf("   C) Control Voltage\n");
    printf("   D) Control Filter Cap\n");
    printf("   E) Cap Leakage\n");
    printf("   F) Charge Pump iref\n");
    printf("   G) Charge Pump Current gain\n");
    printf("   H) Div N Size\n");
    printf("   I) Div N Reload Value\n");
    printf("   J) Max Correction\n");
    printf("   K) Reference Frequency\n");
    printf("   L) Random control voltage noise amplitude\n");
    printf("   M) Random VCO time jitter amplitude\n");
    printf("   N) Simulation Length\n");
    printf("   O) Simulation Time Step\n");
    printf("   P) Output file name\n");
    printf("   Q) Report detail level\n\n");
      printf("  Select Value to Modify - ");
      fflush(stdin);
    scanf("%c",&answ);
    answ=answ|0x20;
    switch(answ) {
        case 'a': // Change the VCO gain
            printf("The current VCO Gain "   - %g GHz/Volt\n",vcogain);
            printf("Enter a new gain value - ");
            scanf("%g",&ftemp);
            vcogain=ftemp;
            break;
        case 'b': // Change the VCO offset value
            printf("The current VCO Offset - %g Volts\n",vcooffset);
            printf("Enter a new offset value - ");
            scanf("%g", &ftemp);
            vcooffset=ftemp;
            break;
        case 'c': // Change the initial control voltage
            printf("The initial VCO control voltage - %g Volts\n",vcntl);
            printf("Enter a new initial control value - ");
            scanf("%g",&ftemp);
            vcntl=ftemp;
            break;
        case 'd': // Change the filter capacitor
            printf("The VCO control voltage filter cap. %g pF\n",cap*1e12);
            printf("Enter a new capacitance value - ");
            scanf("%g", &ftemp);
            cap=1e-12*ftemp;
            break;
        case 'e': // Change the filter capacitor leakage
            printf("The filter cap. impedance %g Mohms\n",leakage*1e-6);
            printf("positive = to gnd, negative = to 1.5V supply\n");
            printf("Enter a new impedance value - ");
            scanf("%g",&ftemp);
            leakage=1e6*ftemp;
            break;
        case 'f': // Change the charge pump reference current
            printf("The charge pump output current is %g uA\n",iref*1e6);
            printf("Enter a new output current value - ");
            scanf("%g",&ftemp);
            iref=1e-6*ftemp;
            break;
        case 'g': // Change the charge pump reference current
            printf("The charge pump output current is %g uA\n",igain*1e6);
            printf("Enter a new output current value - ");
            scanf("%g",&ftemp);
            igain=1e-6*ftemp;
            break;
```

-continued

```
                case 'h': // Change the divider size
                    printf("The current feedback divider is %d bit\n",divnsize);
                    printf("Enter a new divider size - ");
                    scanf("%d",&itemp);
                    if(itemp>16 || itemp<2) {
                       printf("Error: divider must have 2 to 16 bits\n");
                       } else {
                       divnsize=itemp;
                       if(((int) pow(2,itemp-1))-1<loadn) {
                          printf("Warning: Divider smaller then reload, reload
modified\n");
                          loadn=loadn/(1+loadn/((int)pow(2,itemp-1)));
                       }
                    }
                    break;
                case 'i': // Change the reload value
                    printf("The current reload value is %d\n",loadn);
                    printf("Enter a new reload value - ");
                    scanf("%d",&itemp);
                    if(itemp>(int)pow(2,divnsize-1)) {
                       printf("Error: reload value > %d, value not changed\n",
                              (int)pow(2,divnsize-1)-1);
                    } else {
                       loadn=itemp;
                    }
                    break;
                case 'j': // Change the correction limit
                    printf("The maximum correction value is %d\n",latchlimit);
                    printf("Enter a new correction limit - ");
                    scanf("%d",&itemp);
                    latchlimit=itemp;
                    break;
                case 'k': // Change the reference frequency
                    printf("The current reference frequency is %g MHz\n",fref*1e-
6);
                    printf("Enter a new frequency value - ");
                    scanf("%g",&ftemp);
                    fref=1e6*ftemp;
                    break;
                case 'l': // Change the random control voltage amplitude
                    printf("The current random control noise amplitude is %g
volts\n", ranvcntl);
                    printf("Enter a new amplitude value - ");
                    scanf("%g",&ftemp);
                    ranvcntl=ftemp;
                    break;
                case 'm': // Change the random VCO jitter amplitude
                    printf("The current random VCO edge jitter is %g
nsec\n",ranvco*1e9);
                    printf("Enter a new jitter amplitude - ");
                    scanf( "%g",&ftemp);
                    ranvco=1e-9*ftemp;
                    break;
                case 'n': // Change the simulation time length
                    printf("The current simulation runs for %g
usec\n",runtime*1e6);
                    printf("Enter a new time length - ");
                    scanf("%g",&ftemp);
                    runtime=1e-6*ftemp;
                    break;
                case 'o': // Change the simulation setp size
                    printf("The current simulation step size is %g nsec\n,
                           timestep*1e9);
                    printf("Enter a step size - ");
                    scanf("%g",&ftemp);
                    timestep=1e-9*ftemp;
                    break;
                case 'p': // Change the output file name
                    printf("The current output file is %s\n",fname);
                    printf("Enter a new output file name - ");
                    scanf ("%s",fname);
                    break;
                case 'q': // Change the report detail
                    printf("The current detail level is %d\n",detail);
                    printf("Enter a new detail level\n");
                    scanf("%d",&detail);
                    break;
                }
            } else if('r'==answ || 'R'==answ || 'c'==answ || 'C'==answ) {
```

-continued

```
            // initialize the simulation
                if('r'==answ || 'R'==answ ) { // reset simulation to start
                    vco_time=0.0;
                    freftime=0.0;
                    vco_output=0;
                    nlst=0;
                    divn=loadn;
                    latch=0;
                    total_time=0;
                    fll_out=fopen(fname, "w");
                    simprcnt=0;
                } else { // Continue the current simulation
                    vco_time-=endtime;
                    freftime-=endtime;
                    fll_out=fopen(fname, "a");
                    simprcnt=0;
                }
                // Print the initial conditions for the simulation
                    fprintf(fll_out,"FLL Simulator\n");
                    fprintf(fll_out," Current Initial conditions:\n");
                    fprintf(fll_out,"      VCO gain - %.3g GHz/V;",vcogain);
                    fprintf(fll_out,"offset - %.3g Volts\n",vcooffset);
                    fprintf(fll_out,"      Control Voltage - %.3g Volts\n",vcntl);
                    fprintf(fll_out,"      Filter Cap %.3g pF",cap*1e12);
                    if(0<leakage) {
                        fprintf(fll_out," Cap. Leakage - %g Mohms to GND\n",leakage*1e-6);
                    } else {
                        fprintf(fll_out," Cap. Leakage - %g Mohms to 1.5V\n",-leakage*1e-6);
                    }
                    fprintf(fll_out,"      Charge Pump iref - %g uA\n",iref*1e6);
                    fprintf(fll_out,"      Charge Pump Current Gain - %g uA/Volt\n",igain*1e6);
                    fprintf(fll_out,"      Div N Size %d;",divnsize);
                    fprintf(fll_out,"Reload Value %d\n",loadn);
                    fprintf(fll_out,"      Max correction limit %d\n",latchlimit);
                    fprintf(fll_out,"      Reference Frequency - %g MHz\n",fref*1e-6);
                    fprintf(fll_out,"      Random control noise amplitude - %g Volts\n",ranvcntl);
                    fprintf(fll_out,"      Random VCO time jitter - %g nsec\n",ranvco*1e9);
                    fprintf(fll_out,"      Simulation Length %g usec;",runtime*1e6);
                    fprintf(fll_out,"Simulation Step Size %g nsec\n",timestep*1e9);
                    fprintf(fll_out,"      Result file - <%s>",fname);
                    fprintf(fll_out,"Report Detail Level - %d\n\n",detail);
                fprintf(fll_out," Time     ferr VCO     vcntl divn   ltch\n");
                // start simulation loop
                printf("Percent simulation complete - 0 (%g nsec)\n",total_time*1e9);
                rnum1=drand48();
                rnum2=drand48();
                for (time=0.0; time<runtime; time+=timestep) {
                    if(0.05<vcntl-vcooffset) { // The control voltage > minimum
                        if((1/(vcogain*(vcntl+ranvcntl*(rnum2-0.5)-vcooffset)))*5E-10
                            <(time-vco_time)+ranvco*(rnum1-0.5)) {
                            vco_output=1-vco_output;
                            vco_time=time;
                            rnum1=drand48();
                            rnum2=drand48();
                        }
                    } else {
                        if((1/(vcogain*0.05))*5E-10<(time-vco_time)+ranvco*(
                            rnum1-0.5)) {
                            vco_output=1-vco_output;
                            vco_time=time;
                            rnum1=drand48();
                            rnum2=drand48();
                        }
                    }
                    if(0<leakage) {
                        vcntl=vcntl*(1.0-timestep/(leakage*cap));
                    } else {
                        vcntl=vcntl-(1.5-vcntl)*timestep/(leakage*cap);
                    }
                    if(0!=latch) { // Correct the VCO control voltage
                        if(0>latch) { // To fast, reduce the voltage
                            vcntl=vcntl-(iref+vcntl*igain)*timestep/cap;
                        } else { // To slow, increase the voltage
                            vcntl=vcntl+(iref+vcntl*igain) *timestep/cap;
```

-continued

```
                }
            }
            if((1==nlst)&&(0==vco_output)) { // clock falling edge of VCO
                if(0<((int)pow(2,divnsize-1))+divn) { // Count not terminal
                    divn--;
                }
                if(0!=latch) { // Update correction time
                    if(0>latch) {
                        latch++;
                    } else {
                        latch--;
                    }
                }
                if(2==detail) { // Report on every count point
                    ferror=vcogain* (vcntl-vcooffset)*1E9-fref*loadn;
                    fprintf(fll_out,"%6.4g %10.3g %d %8.6g %4.4d %5.4d\n"
                            ,total_time*1e6,ferror,vco_output,vcntl,divn,latch);
                }
            }
            nlst=vco_output;
            if(1/fref<time-freftime) { // Time to reload
                latch=divn;
                if(latch>latchlimit) { // Set correction to maximum
                    latch=latchlimit;
                } else {
                    if(latch<-latchlimit) { // Set correction to maximum
                        latch=-latchlimit;
                    }
                }
                divn=loadn;
                freftime=time;
                if(1>=detail) { // Report on every sample point
                    ferror=vcogain*(vcntl-vcooffset)*1E9-fref*loadn;
                    fprintf(fll_out,%6.4g %10.3g %d %8.6g %4.4d %5.4d\n"
                            ,total_time*1e6, ferror,vco_output,vcntl,divn,latch);
                }
            }
            if(3<=detail) { // Report on every step
                ferror=vcogain*(vcntl-vcooffset)*1E9-fref*loadn;
                fprintf(fll_out,"%6.4g %10.3g %d %8.6g %4.4d %5.4d\n"
                        ,total_time*1e6,ferror,vco_output,vcntl,divn,latch);
            }
            if(100*(time/runtime)>simprcnt+1) {
                simprcnt=(int) (100*(time/runtime));
                printf("Percent simulation complete - %d (%g nsec)\n,
                        simprcnt,total_time*1e9);
            }
            total_time+=timestep;
        }
        endtime=runtime;
        fclose(fll_out);
        printf("\n");
    } else if('e'==answ || 'E'==answ) { // Exit the program
        printf("Exiting simulations\n");
        exit(0);
    } else { // Unknown command
        printf("Error: Unknown Command - %c\n");
    }
} while(1); // Loop forever (exit is above)
}
```

What is claimed is:

1. A frequency lock loop, comprising:
a reloadable counter for counting cycles of an output frequency during one cycle of a reference frequency to generate a count, the counter operable to count from a reloadable initial value to a terminal count value without counting past the terminal count value;
a frequency controlled oscillator for generating the output frequency as an output from the frequency lock loop; and
a controller for driving the frequency controlled oscillator based on the count from the counter.

2. A frequency lock loop of claim 1, the controller comprising a latch for latching the count.

3. A frequency lock loop of claim 2, the latch latching the count at each cycle of the reference frequency.

4. A frequency lock loop of claim 1, the counter being reloaded with an integer value at each cycle of the reference frequency.

5. A frequency lock loop of claim 4, the counter decrementing from the integer value at each cycle of the output frequency.

6. A frequency lock loop of claim 1, the controller comprising a VCO driver.

7. A frequency lock loop of claim 6, the VCO driver comprising a D/A converter.

8. A frequency lock loop of claim 6, the VCO driver comprising a proportional charge pump clocked by the output frequency, to proportionally adjust an input signal driving the frequency controlled oscillator.

9. A frequency lock loop of claim 1, the frequency controlled oscillator comprising a VCO and the controller comprising a voltage control as input to the VCO.

10. A method for generating an output frequency from an input frequency, comprising the steps of:
loading an initial value to a reloadable counter;
electronically counting a number of cycles of the output frequency for each cycle of the input frequency, from the initial value toward a terminal count value without counting past the terminal count value; and
electronically modifying the output frequency based upon the number of cycles counted.

11. A method of claim 10, further comprising reloading the counter with the value at each cycle of the reference frequency.

12. A method of claim 10, the step of electronically modifying comprising the step of latching a count from the counter at each cycle of the reference frequency.

13. A method of claim 10, the step of electronically modifying comprising the step of converting a count from the counter to a voltage as input to a frequency controlled oscillator.

14. A method of claim 13, the step of converting comprising utilizing a D/A converter.

15. A method of claim 13, the step of converting comprising the step of modifying a charge to the frequency controlled oscillator for each cycle of the output frequency.

16. A method of claim 10, the step of electronically modifying comprising applying a charge to a voltage control of an oscillator generating the output frequency as a function of the number of cycles of the output frequency.

17. In a processor of the type having a bus reference frequency and a clock speed, the improvement comprising:
at least one FLL having a reloadable N counter for counting cycles of an output frequency of the FLL during one cycle of the reference frequency, from a reloadable initial value N toward a terminal count value without counting past the terminal count value, to generate a count,
a frequency controlled oscillator for generating the output frequency as an output of the FLL, and
a controller for driving the frequency controlled oscillator based on the count from the counter.

18. In a processor of claim 17, the further improvement wherein the output frequency substantially corresponds to the clock speed.

19. In a processor of claim 17, the further improvement wherein the FLL comprises a latch for latching the count and a driver for utilizing the count to drive the frequency controlled oscillator.

* * * * *